(12) United States Patent
Ikeda et al.

(10) Patent No.: US 7,274,103 B2
(45) Date of Patent: Sep. 25, 2007

(54) SEMICONDUCTOR DEVICE AND MANUFACTURING METHOD THEREOF

(75) Inventors: Osamu Ikeda, Yokohama (JP); Masahide Okamoto, Yokohama (JP); Yukihiro Satou, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/272,063

(22) Filed: Nov. 14, 2005

(65) Prior Publication Data

US 2006/0186550 A1   Aug. 24, 2006

(30) Foreign Application Priority Data

Feb. 24, 2005   (JP) ............... 2005-048808

(51) Int. Cl.
*H01L 23/52* (2006.01)
(52) U.S. Cl. ............ 257/772; 257/737; 257/750; 257/E21.508
(58) Field of Classification Search ........ 257/737, 257/750, 772
See application file for complete search history.

(56) References Cited

U.S. PATENT DOCUMENTS 5,973,932 A * 10/1999 Nguyen .............. 361/779
2002/0090756 A1 * 7/2002 Tago et al. ............. 438/108
2002/0149114 A1 * 10/2002 Soga et al. ............. 257/772
2002/0171157 A1 * 11/2002 Soga et al. ............. 257/783
2005/0275096 A1 * 12/2005 Zeng et al. ............. 257/737

OTHER PUBLICATIONS

Electronic Packaging and Interconnection Handbook 3rd Edition Charles A Harper McGraw-Hill, 2000, Chapter 6.*
High Temperature Joints Manufactured at Low Temperature, William W. So and Chin C. Lee pp. 284-291.
Reactivity to Form Intermetallic Compounds in The Micro Joint Using Sn-Ag Solder: T. Yamamoto et al. pp. 45-48.

* cited by examiner

*Primary Examiner*—Sue A. Purvis
*Assistant Examiner*—Krista Soderholm
(74) *Attorney, Agent, or Firm*—Antonelli, Terry, Stout & Kraus, LLP.

(57) ABSTRACT

In a semiconductor module connecting a semiconductor element and a passive element to a printed board, each of connection portions between the semiconductor element and the printed board and between the passive element and the printed board includes a metal with a melting point of 260° C. or higher and an intermetallic compound with a melting point of 260° C. or higher. Specifically, by connecting them using Pb-free solder with a melting point of 260° C. or lower, the printed board capable of lowering in cost, lightening, and reducing back height can be applied to a module board.

11 Claims, 8 Drawing Sheets

FIG. 10

| | Constitution of Connection Portion | Connection Structure | Connection Condition | Damage to Printed Board | Reflow (260°C) |
|---|---|---|---|---|---|
| Example 1 | Sn-In(10 μm)+Cu | FIG.7 | 240°C10min. | ○ : 0/20 | ○ : 0/20 |
| 2 | Sn-In(10 μm)+Ag | FIG.7 | 240°C10min. | ○ : 0/20 | ○ : 0/20 |
| 3 | Sn-Zn(10 μm)+Ag | FIG.7 | 240°C10min. | ○ : 0/20 | ○ : 0/20 |
| 4 | Sn-In(10 μm)+Ag/Al(100 μm)/Sn-In(10 μm)+Ag | FIG.4 | 240°C10min. | ○ : 0/20 | ○ : 0/20 |
| 5 | Sn-In(10 μm)/(Cu/Invar Alloy/Cu Compound Material)(100 μm)/Sn-In(10 μm) | FIG.4 | 240°C10min. | ○ : 0/20 | ○ : 0/20 |
| 6 | Sn-Zn(10 μm)+Ag/Al(100 μm)/Sn-Zn(10 μm)+Ag | FIG.4 | 240°C10min. | ○ : 0/20 | ○ : 0/20 |
| Comparative Example 1 | Pb-5Sn | FIGs. 1 and 2 | 350°C1min. | × : 20/20 | - |
| 2 | Au-20Sn | FIGs. 1 and 2 | 300°C1min. | × : 20/20 | - |

SEMICONDUCTOR DEVICE AND MANUFACTURING METHOD THEREOF

CROSS-REFERENCE TO RELATED APPLICATION

The present application claims priority from Japanese patent application No. JP 2005-048808 filed on Feb. 24, 2005, the content of which is hereby incorporated by reference into this application.

BACKGROUND OF THE INVENTION

The present invention relates to a manufacturing technique for semiconductor devices and, particularly, to a technique effectively applied to a semiconductor module, in which a semiconductor element and a passive component are connected to a printed board by an intermetallic compound containing "no lead" (hereinafter referred to as "Pb-free"), and to a manufacturing method of the same.

Regarding conventional semiconductor modules, the following techniques have been considered by the inventors.

FIGS. 1 and 2 show sectional views semiconductor modules in the form of conventional structures. A semiconductor element 3 and a passive element 4 are connected onto a module board 6. After wire-bonding by wires 2, the module board is sealed with a mold resin 1 or inert gas 11 in a sealing casing 1. Pads 7 for the semiconductor module are reflow-soldered to pads 7 for the printed board 9 by medium-temperature Pb-free solder 8 of Sn—Ag—Cu base. The melting point of the Sn—Ag—Cu base Pb-free solder is as high as approximately 220° C., and it is assumed that the solder is heated up to 260° C. at maximum at a time of reflow connection. Therefore, for the purpose of temperature hierarchy, high-lead solder with a melting point of 290° C. or higher is used for connection of the semiconductor element 3 and the passive element 4 inside the semiconductor module. For this reason, high refractory ceramic boards (for example, $Al_2O_3$, AlN, or $Si_3N_4$) or metal boards (of, for example, Al, Cu, or Fe base) are used as the module boards 6 of the semiconductor module. However, use of such module boards 6 results in high cost and further manufacture of semiconductor packages results in high cost. Moreover, the ceramic or metal-module board is generally heavy and thick, and this results in increases in weight and back height of parts.

A board capable of lowering in cost, lightening in weight, thinning, and decreasing in package back height includes a printed board such as FR-4 for use in mounting the semiconductor element or passive element by the Sn—Ag—Cu base solder. However, such a board has a heat-resistant temperature of 300° C. or lower, so that the connection by high-melting solder such as high-lead solder or Au-20Sn causes damage to the board by heating, which results in destruction of the board. To use the printed board as the module board, it is desirable that internal connection is made by a material capable of connecting at a temperature of 260° C. or lower for secondary packaging. However, if the internal connection is made by solder with a melting point of 260° C. or lower, the solder is remelted at the time of reflow soldering. When a circumference of a connection portion is molded with a resin and the solder inside thereof is remelted, as shown in FIG. 3, there often arises what is called "flash", i.e., a leakage of the solder 8 from an interface between the mold resin 1 and the module board 6 due to-volume expansion by melting. Even if not leaked, the solder acts to leak therefrom and, as a result, large voids 12 are formed in the solder after coagulation and the printed boards are defective products.

For example, by non-patent document 1 ("High Temperature Joints Manufactured at Low Temperature" written by William W. So, et al., Proceeding of ECTC, 1998, p. 284), the following has been reported. GaAs having a back surface metallized with Cr: 0.03 μm/Sn: 2.5 μm/Cu: 0.1 μm and a board (Glass) metallized with Cr: 0.03 μm/Cu: 4.4 μm/Au: 0.1 μm are connected to each other at 280° C. and then are kept for 16 to 24 hours, so that the melting point of the connection portion can be made high by transforming completely the connection portion into $Cu_3Sn$. Similarly, Si having a back surface metallized with Cr: 0.03 μm/In: 3.0 μm/Ag: 0.5 μm and Si metallized with Cr: 0.03 μm/Au: 0.05 μm/Ag: 5.5 μm/Au: 0.05 μm are connected to each other at 160 to 200° C. and then are subject to a aging treatment for 16 to 24 hours at 150° C., so that the melting point of the connection portion can made high by transforming the connection portion into "an Ag-rich alloy+$Ag_3In$".

Also, in non-patent document 2 ("Study on transforming a micro-connection portion into an intermetallic compound by using Sn—Ag solder" written by Yamamoto, et al., Summary of MES 2003, Oct. 2003, p. 45), the following has been reported. Ni-xCo (x=0.10) metallized with Sn-3.5Ag: 26 μm; solder; and Kovar metallized with Ni-20Co: 5 μm/Au: 1 μm are connected together at 240° C. and then are kept for 30 minutes, so that all the connection portions can be transformed into (Ni, Co) $Sn_2$+(Ni, Co)$_3Sn_4$ and their melting points can be made high. By the use of Ni-20Co containing Co for metallization, a growth rate of the compound can be increased.

By using the above-described schemes, the connection can be made at a temperature of 260° C. or lower, so that once the connection portion completely becomes a high-melting layer, the connection portion is not remelted and can be maintained even if being heated to 260° C. at the time of reflow soldering.

SUMMARY OF THE INVENTION

Incidentally, the inventors have thought as connecting scheme that the technique for making the melting points high using the compounds obtained by the reactions described in the above-mentioned non-patent documents 1 and 2 can be applied. However, the techniques described in these two non-patent documents do not take the following points into consideration.

In the techniques described in the non-patent documents 1 and 2, only the connection between high refractory materials, such as between GaAs and the board (Glass), between Si and Si, or between Kovar and Kovar, is mentioned. For this reason, the connection is made through heating at a temperature of, for example, 280 or 240° C. and for 30 minutes or longer. If the semiconductor element and the passive component are connected onto the printed board under such conditions, the printed board may be damaged by heat to be destroyed.

Therefore, an object of the present invention is to provide a manufacturing technology for semiconductor devices, which can reduce damage to the printed board by: specifying a material with a melting point of 260° C. or lower so as to be applied to the connection portion; providing the connection portion with a metal layer that reacts with the Pb-free solder at 260° C. or lower to form the compound with a melting point of 260° C. or higher; and thereby increasing the reactive interface.

The above and other objects and novel features in the present invention will become apparent from the description of the present specification and the accompanying drawings.

Outlines of representative ones of the inventions disclosed in the present application will be briefly described as follows.

The present invention is applied to a semiconductor device including a semiconductor element, a passive component, and a printed board having connected thereon the semiconductor element and the passive component, and to a semiconductor manufacturing method including a step of connecting a semiconductor element and a passive component onto a printed board through metal junction. In particular, at a connecting portion between the semiconductor element and the passive component, and the printed board, a material having a melting point not higher than 200° C., such as Sn, In, Sn—Ag base, Sn—Cu base, Sn—Ag—Cu base, Sn—Zn base, Sn—Zn—Bi base, Sn—In base, In—Ag base, In—Cu base, Bi—Sn base, or Bi—In base, is applied as a material having a melting point not higher than 260° C. Also, the connecting portion is provided with a metal layer of, for example, Cu, Ag, Ni, or Au, that reacts with a Pb-free solder having a melting point not higher than 260 degree Celsius to form an intermetallic compound having a melting point not lower than 260° C., thereby increasing a reactive surface.

Also, the present invention is similarly applied to a semiconductor device including a semiconductor element and a printed board having connected thereon the semiconductor element, and to a semiconductor device manufacturing method including a step of connecting a semiconductor element onto a printed board through metal junction. The semiconductor device and the semiconductor device manufacturing method are arbitrary as long as at least the semiconductor element is connected onto the printed board.

BRIEF DESCRIPTION OF THE DRAWINGS

FIG. 10 is a view showing results of a study on whether the printed board is damaged at a time of internal connection and whether the connection can be maintained at a time of a reflow test, in the semiconductor modules according to the first and second embodiments of the present invention and the conventional technique.

DESCRIPTION OF THE PREFERRED EMBODIMENTS (Concepts of the Invention)

The concepts of a semiconductor device according to the present invention will be described with reference to FIGS. 4 to 7. The present invention is directed to a semiconductor device, in which a semiconductor element (and a passive component) is connected onto a printed board, and has the following features obtained from items (1) to (7). Also, the present invention is directed to a manufacturing method for semiconductor devices, in which the semiconductor element (and the passive component) is connected onto the printed board through metal junction, and has the following features obtained from items (8) to (15).

(1) A connection portion between the semiconductor element (and the passive component) and the printed board includes a metal with a melting point of 260° C. or higher and an intermetallic compound with a melting point of 260° C. or higher. If a low-melting phase with a melting point of 260° C. or lower remains in the connection portion at a time of secondary implementation, the low-melting phase is remelted when the secondary implementation is performed, so that the above-described flash or peeling by remelting occurs and the connection cannot be maintained in some cases. Therefore, the connection portion is made of only metal and an intermetallic compound each having a melting point of 260° C. as described above, the connection can be maintained at a time of the secondary implementation.

Figure 4:
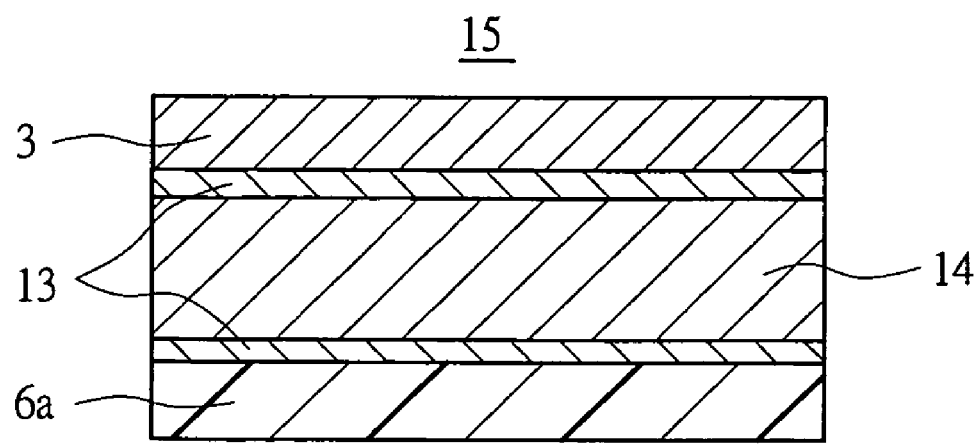
FIG. 4 is a sectional view showing a connection portion in a semiconductor module according to the present invention.

(2) The connection portion includes, from a side(s) of the semiconductor element (and the passive component), a layer of the intermetallic compound with a melting point of 260° C. or higher, a layer of the metal with a melting point of 260° C. or higher, and a layer of the intermetallic compound with a melting point of 260° C. or higher. FIG. 4 shows a sectional view of a connection portion 15 is (intermetallic compounds 13 and a high-melting metal (with a melting point of 260° C. or higher) 14) between the semiconductor element 3 and the printed board 6a. Note that a Cu land is specifically formed on a surface of the printed board 6a although not omitted in the view. When metal that reacts with Pb-free solder at 260° C. or lower to form an intermetallic compound is applied to the above metal layers, the connection can be made within a short period at low temperature by selecting metal with a high reaction rate. Also, if soft material or metal with an intermediate value between coefficients of thermal expansion of the semiconductor element and the printed board is applied to the metal layers, a thermal stress occurring due to a difference in the coefficient of thermal expansion between materials to be connected can be relaxed and cracks occurring in the semiconductor element and the connection portion can be inhibited.

Figure 5:
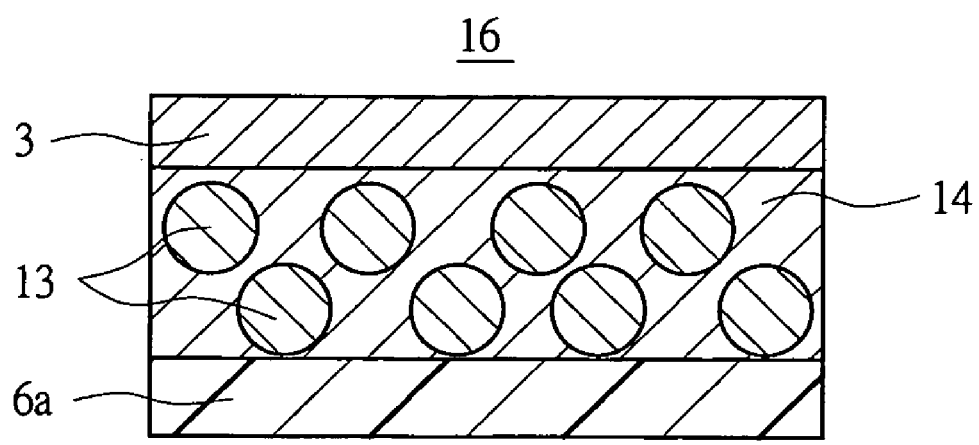
FIG. 5 is a sectional view showing another connection portion in the semiconductor module according to the present invention.

(3) The connection portion includes a layer in which the intermetallic compound with a melting point of 260° C. or higher and the metal with a melting point of 260° C. or higher are dispersed. FIG. 5 shows a sectional view of a connection portion 15 (the intermetallic compounds 13 and the high-melting metal (with a melting point of 260° C. or higher) 14) between the semiconductor element 3 and the printed board 6a (, wherein the Cu land is omitted). As with the item (2), if metal that reacts with the Pb-free solder at 260° C. or lower to form the intermetallic compound is applied to the metal with a melting point of 260° C. or higher, the reactive interface is increased. Thus, the connection can be made at low temperature within a short period. Also, if a soft material or metal with an intermediate value between coefficients of thermal expansion of the semiconductor element and the printed board is applied, the thermal stress occurring due to the difference in the coefficient of thermal expansion between the materials to be connected can be relaxed and the cracks occurring in the semiconductor element and the connection portion can be inhibited.

(4) The intermetallic compound with a melting point of 260° C. or higher is formed through a reaction at a time of die-mount connection between at least one of Pb-free solders of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base each having a melting point of 260° C. or lower and at least one of metals of Cu, Ag, Ni, and Au. Since these materials each have a melting point equal to or more than the heat-resistant temperature of the printed board, the connection made within a short period does not destroy the printed board. However, if it takes time to transform the materials into compounds, the printed board may be damaged in some cases. Therefore, it is necessary to make the connection at as low temperature as possible and to be transformed into compounds within the short period. As described in the item (2), when the connection portion has a multilayer structure, the thickness of the intermetallic compound layer in the connection portion must be set to 1 µm to 20 µm. If the thickness is 1 µm or smaller, leakages over the entire connection-interface area cannot be ensured at the time of connection, which results in poor connection. If the thickness is larger than 20 µm, it takes a long time to transform the entire connection portion into the compounds, which results in a problem of damage to the printed board. Meanwhile, if the intermetallic compound and the metal are dispersed as described in the item (3), the thickness of the connection portion does not have to be defined unlike the case of the multilayer structure. However, if a ratio of metal occupation is 10 volume % or lower of the connection portion, the reactive interface cannot be sufficiently ensured, so that it becomes difficult to make the melting point of the connection portion high within the short period.

(5) The metal with a melting point of 260° C. or higher includes at least one of metals of Cu, Ag, Ni, and Au, which reacts with Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders each having a melting point of 260° C. or lower and forms an intermetallic compound. As described above, by providing the connection portion with the Pb-free solder with a melting point of 260° C. or lower and the metal for forming the intermetallic compound, the reactive interface can be increased, so that it is possible to make temperature and time required for the connection lower and shorter, respectively.

Figure 6:
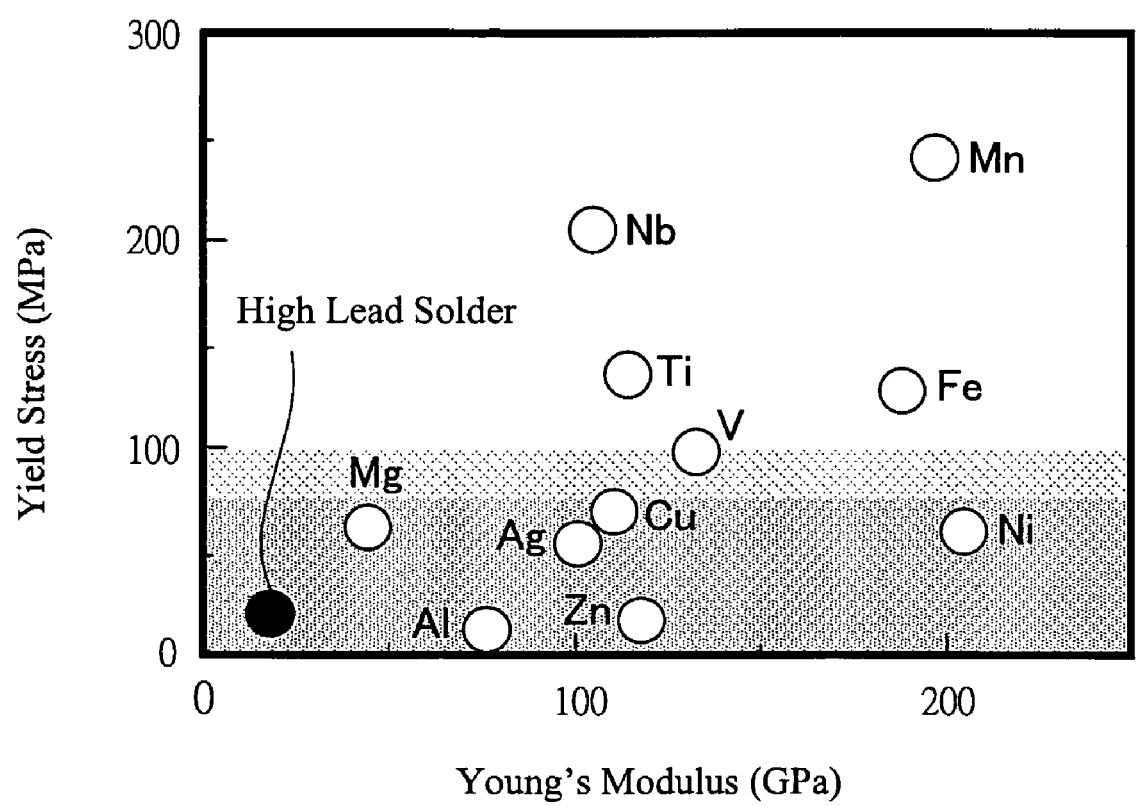
FIG. 6 is an explanatory view for showing Young's moduli and yield stresses of various materials in the semiconductor module according to the present invention.

(6) In the metal with a melting point of 260° C. or higher, at least one of Al, Zn, Mg, Cu/an Invar alloy/a Cu composite material, a Cu/Cu$_2$O composite material, a Cu—Mo alloy, Ti, Mo, and W is metallized with at least one of Cu, Ag, Ni, and Au, which reacts with at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders each having a melting point of 260° C. or lower and forms an intermetallic compound. FIG. 6 shows a Young's modulus and a yield stress of each metal. Al, Zn, and Mg are relatively soft metals, and these metals are plastically deformed at a time of occurrence of a thermal stress, so that the thermal stress is relaxed and reliability of the connection portion can be ensured. The yield stress of the metal is preferably 75 MPa or smaller. If the yield stress is 100 MPa or larger, the above metals cannot sufficiently absorb the yield stress, so that the cracks may occur in the semiconductor element and the connection portion. The yield stress does not largely depend on the Young's modulus, but is smaller preferably. Meanwhile, Cu/an Invar alloy/a Cu composite material, a Cu/Cu$_2$O composite material, a Cu—Mo alloy, Ti, Mo, and W each have an intermediate value between the coefficients of thermal expansion of the semiconductor element and the printed board, whereby the occurring thermal stress can be relaxed. Also, if the Pb-free solder with the low melting point and these metals form no intermetallic compound, a layer of Cu, Ag, Ni, or Au must be formed on a surface of the metal.

Figure 7:
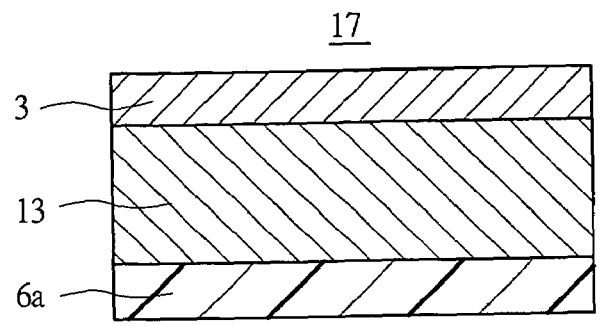
FIG. 7 is a sectional view showing still another connection portion in the semiconductor module according to the present invention.

(7) The connection portion between the semiconductor device (and the passive component) and the printed board includes an intermetallic compound with a melting point of 260° C. or higher. FIG. 7 shows a sectional view of a connection portion 17 (intermetallic compound 13) between the semiconductor element 3 and the printed board 6a (where the Cu land is omitted). In a Pb-free solder made of a material such as Sn—Zn, Sn—In, or Sn—Bi, the connection temperature is low such as 200° C. or lower. Therefore, without increasing the reactive interface, the use of a phase of the above-mentioned metal makes it possible to transform the connection portion into a compound within the short period in some cases. Also, the thermal stress caused at a time of cooling after the connection is small, so that sufficient reliability can be achieved in some cases even if the above-described metal phase is not provided.

(8) Compound foil, in which a metal layer with a melting point of 260° C. or lower forming the intermetallic compound with a melting point of 260° C. or higher by reacting with the metal layer with a melting point of 260° C. or higher is provided, is interposed between the semiconductor device (and the passive component) and the printed board and, by heating the compound foil in such an interposed state, metal junction is formed.

(9) The metal layer with a melting point of 260° C. or higher is made of at least one of Cu, Ag, Ni, and Au. The metal layer with a melting point of 260° C. or lower that forms, through reaction, the intermetallic compound with a melting point of 260° C. or higher includes at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders.

The metal layer with a melting point of 260° C. or higher that forms, through reaction, an intermetallic compound with a melting point of 260° C. or higher includes at least one of Cu, Ag, Ni, and Au metals. The Pb-free solder is a material with a melting point equal to of lower than the heat-resistant temperature of the printed board, so that the connection made within a short period does not destroy the printed board. However, if it takes time to transform the material into a compound, the printed board may be damaged. Therefore, it becomes necessary to make the connection at as low temperature as possible and transform the material into a compound within a short period.

(10) The compound foil is obtained by forming, through plating, at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders on a surface of at least one of Cu, Ag, Ni, and Au metals. At this time, the thickness of the plating is required to be 1 to 20 μm. If the thickness is 1 μm or smaller, the leakage over the entire connection interface area cannot be ensured at the time of connection, whereby the poor connection is caused. If the thickness is larger than 20 μm, it takes a long time to transform the entire connection portion into a compound, so that a problem of damaging the printed board arises.

(11) The compound foil is obtained by forming, through dipping, at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders on a surface of at least one of Cu, Ag, Ni, and Au metal. As with the item (10), the thickness of the dipping is required to be 1 to 20 μm. If the thickness is 1 μm or smaller, the leakage over the entire connection interface area cannot be ensured at the time of connection, whereby the poor connection is caused. If the thickness is larger than 20 μm, it takes a long time to transform the entire connection portion into a compound, so that a problem of damaging the printed board arises.

(12) A metal layer with a melting point of 260° C. or lower that reacts with a metal layer with a melting point of 260° C. or higher and forms an intermetallic compound with a melting point of 260° C. is provided on a side of the printed board, and is heated in a state where the semiconductor element (and the passive component) is mounted on the printed board and, by heating in such a mounted state, the metal junction is formed.

(13) The metal layer with a melting point of 260° C. or higher is made of at least one of Cu, Ag, Ni, and Au. The metal layer with a melting point of 260° C. or higher that forms, through reaction, the intermetallic compound with a melting point of 260° C. or higher includes at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders. The metal layer with a melting point of 260° C. or higher that forms, through reaction, the intermetallic compound with a melting point of 260° C. or higher includes at least one of Cu, Ag, Ni, and Au metals. The Pb-free solder is a material with a melting point equal to or less than the heat-resistant temperature of the printed board, so that the printed board is not destroyed by the connection made within the short period. However, if it takes time to transform the material into a compound, the printed board may be damaged. Therefore, it becomes necessary to make the connection at as low temperature as possible and transform the material into a compound within the short period.

(14) The metal layer formed on the printed board is formed of, through plating, at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders on a surface of at least one of Cu, Ag, Ni, and Au metal. At this time, the thickness of the plating is required to be 1 to 20 μm. If the thickness is 1 μm or smaller, the leakage over the entire connection interface area cannot be ensured at the time of connection, whereby the poor connection is caused. If the thickness is larger than 20 μm, it takes a long time to transform the entire connection portion into a compound, so that a problem of damaging the printed board arises.

(15) The metal layer formed on the printed board is formed of, through dipping, at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders on a surface of at least one of Cu, Ag, Ni, and Au metal. As with the item (14), the thickness of the dipping is require to be 1 to 20 μm. If the thickness is 1 μm or smaller, the leakage over the entire connection interface area cannot be ensured at the time of connection, whereby the poor connection is caused. If the thickness is larger than 20 μm, it requires a long time to transform the entire connection portion into a compound, so that a problem of damaging the printed board arises.

Figure 1:
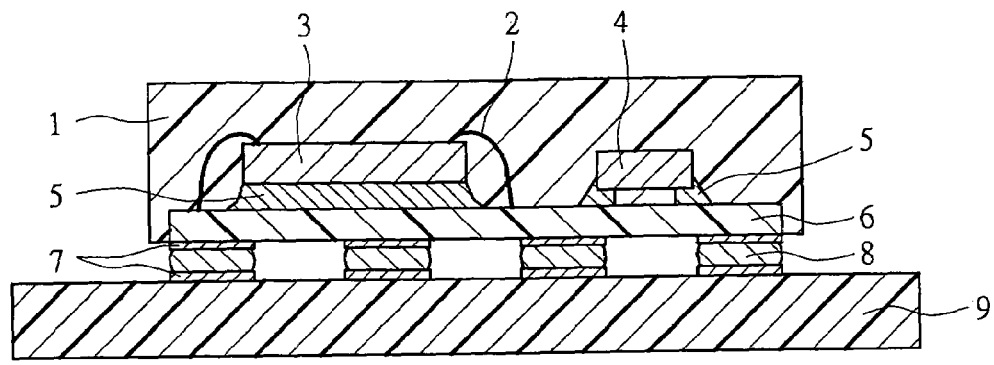
FIG. 1 is a sectional view showing a semiconductor module in the form of a conventional technique.
Figure 2:
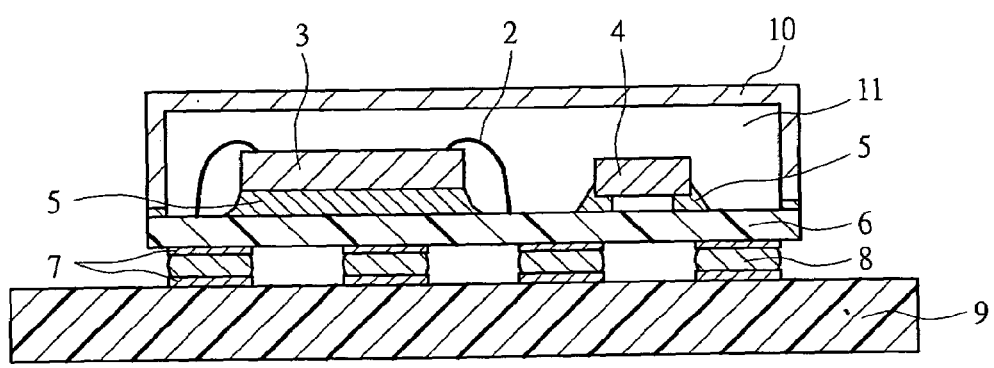
FIG. 2 is a sectional view showing another semiconductor module in the form of the conventional technique.
Figure 3:
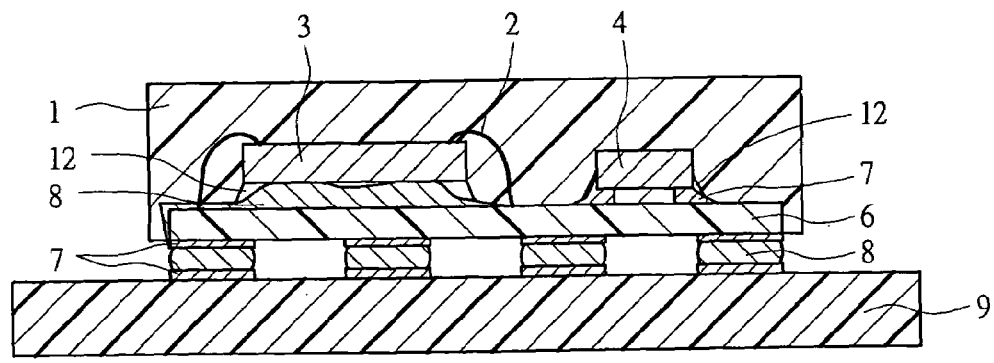
FIG. 3 is a sectional view for explaining a flash caused by remelted solder in the semiconductor module in the form of conventional technique.

Embodiments according to the present invention based on the above-described concepts will be described in detail below with reference to the drawings. Note that, throughout all the drawings for explaining the embodiments including the form of the conventional technique shown by FIGS. 1 and 2 as described above, the same components are denoted in principle by the same reference numerals and the repetitive explanation thereof will not be omitted.

First Embodiment

Figure 8:
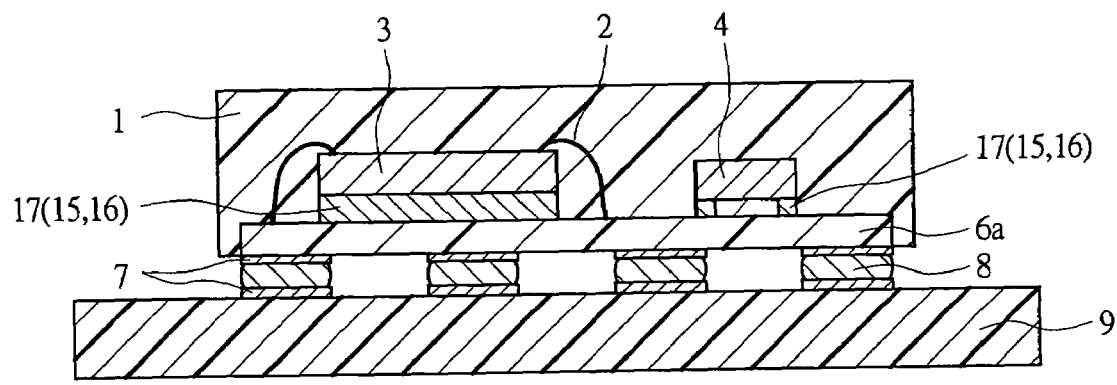
FIG. 8 is a sectional view showing a semiconductor module according to a first embodiment of the present invention.

FIG. 8 shows a sectional view of a semiconductor device according to a first embodiment of the present invention.

The semiconductor device according to the present embodiment is applied to, for example, a power semiconductor module, and comprises a semiconductor element 3, a passive element (passive component) 4, a printed board (module board) 6a connecting the semiconductor element 3 and the passive element 4, wires 2 for wire-bonding between an electrode of the semiconductor element 3 and an electrode of the printed board 6a, and a mold resin 1 for sealing the semiconductor module, etc. This semiconductor module is mounted on the printed board 9, thereby being incorporated in various devices.

Figure 9:
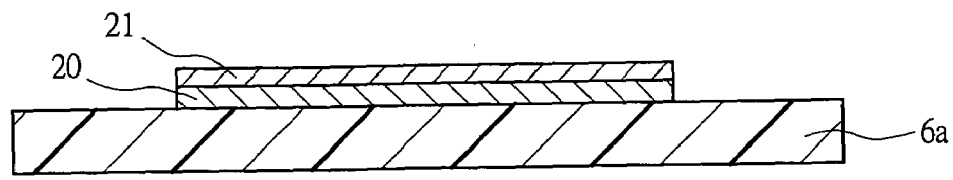
FIG. 9 is a sectional view showing a state of providing a printing board with each of a high-melting metal layer and a low-melting solder layer in the semiconductor module according to the first embodiment of the present invention.

The process of manufacturing this semiconductor module will be described below. For example, when the internal connection of the semiconductor module is made by a structure of the connecting portion 17 of FIG. 7 as described above, a layer of a high-melting metal 20 and a layer of low-melting solder 21 made of Pb-free solder with a melting point of 260° C. or lower as shown in FIG. 9 are provided to mounting portions of the semiconductor element 3 and the passive element 4 on the printed board 6a used as a module board, respectively. These layers are formed through plating, dipping, or the like.

The semiconductor element 3 and the passive element 4 are connected to the mounting portion at such temperature as not to damage the printed board 6a. At this time, the high-melting metal 20 and the low-melting solder 21 are made to react with each other to transform a connection portion 17 into a compound with a high melting point. Next, the electrode formed on a surface of the semiconductor element 3 and the electrode formed on the printed board 6a are wire-bonded to each other by the wires 2. Then, the semiconductor module is sealed by using the mold resin 1 such as an epoxy-base resin. Through the process as described above, the semiconductor module can be manufactured.

Next, regarding the semiconductor module according to the present embodiment, the semiconductor modules manufactured under respective conditions of Examples 1 to 3 of FIG. 10 (20 semiconductor modules for each condition) were examined as to whether the printed board (FR-4) 6a is damaged at the time of internal connection and whether the connection can be kept in a reflow test at a maximum temperature of 260° C. The results are shown in FIG. 10.

A constitution of the above-described connection portion 17 of FIG. 7 was set to "Sn—In (10 μm)+Cu" in the Example 1, "Sn—In (10 μm)+Ag" in the Example 2, and "Sn—Zn (10 μm)+Ag" in the Example 3, as an example among intermetallic compounds made of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, or Bi—In base Pb-free solder and Cu, Ag, Ni, or Au metal.

Figure 11:
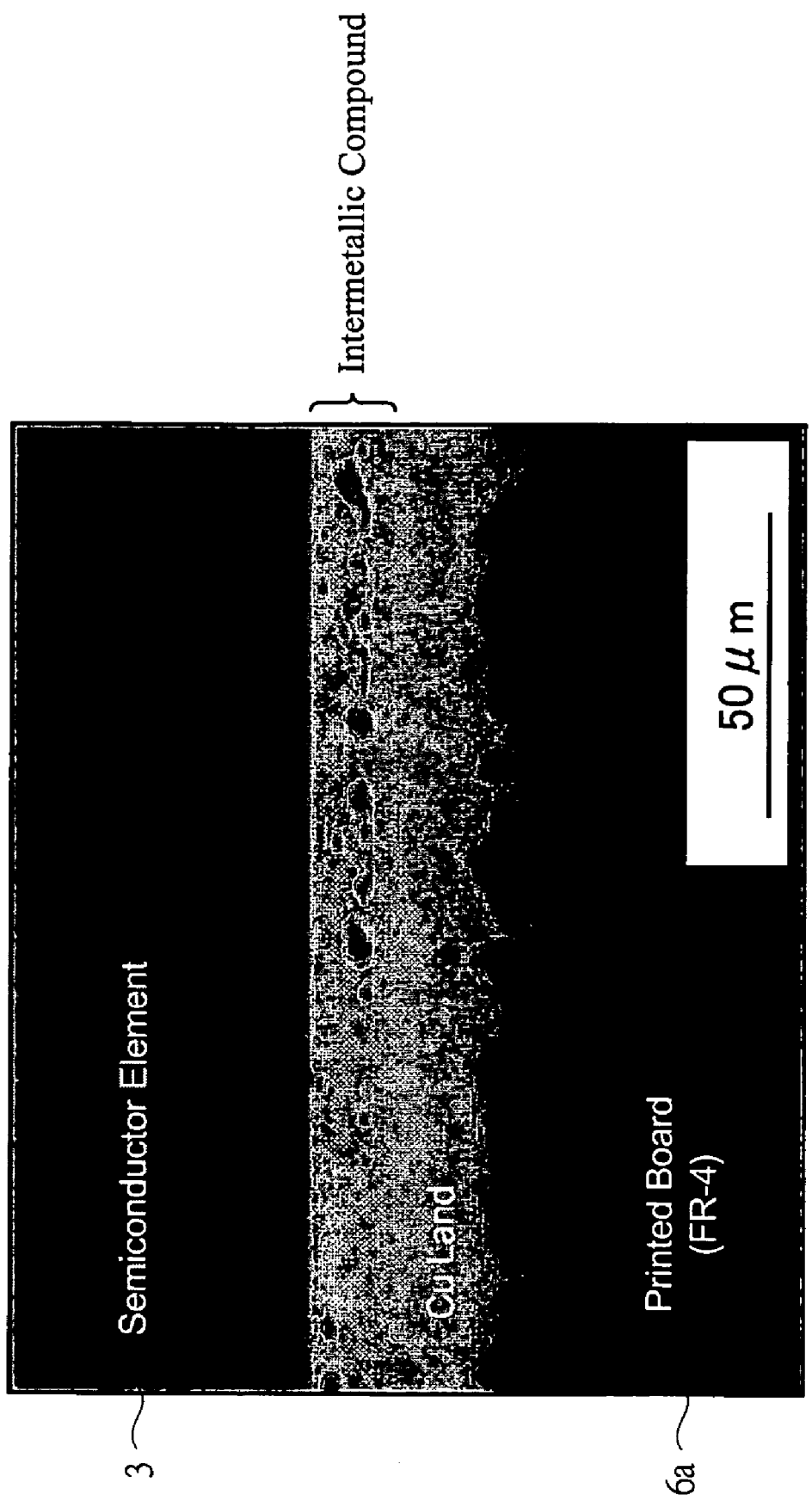
FIG. 11 is a view showing a sectional photograph in a state in which all the connection portions are transformed into compounds to form an intermetallic compound in the semiconductor module according to the first embodiment of the present invention.

As a result, through all of the Examples 1 to 3, no abnormality was found in the printed board 6a under the connection condition of 240° C. for 10 minutes. Also, under the connection condition of 240° C. for 10 minutes, it was confirmed as shown in FIG. 11 that the entire connection portion 17 was transformed into the intermetallic compound. Furthermore, as a result of the reflow test on the manufactured semiconductor module at the maximum temperature of 260° C., it was confirmed through all of the semiconductor modules that the flash and peeling involved by remelt of the solder can be inhibited and thereby the connection can be kept.

From the above-described results, it has been found that the printed board 6a can be applied to the module board through the above-described connection scheme.

Therefore, the printed board 6a, which is capable of lowering in cost, lightening in weight, thinning, and decreasing in back height, can be applied to the module board. Furthermore, damage to this printed board 6a can be also inhibited.

Second Embodiment

A semiconductor device according to a second embodiment of the present invention has the same constitution as that shown in the sectional view of FIG. 8 as described in the first embodiment but is different from it in that the structure of the above-described connection portion 15 in FIG. 4 is applied to the internal connection of the semiconductor module. Note that the case where the above-described structure of the connection portion 16 in FIG. 5 is applied is also the same.

Figure 12:
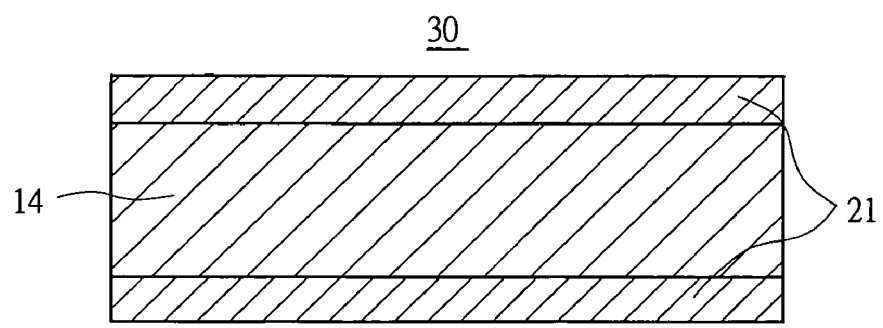
FIG. 12 is a sectional view showing a compound foil in the semiconductor module according to the second embodiment of the present invention.

A process of manufacturing this semiconductor module will be described below. When the internal connection of the semiconductor module is carried out by the above-described structure of the connection portion 15 in FIG. 4, a compound foil 30 shown in FIG. 12 is supplied onto the printed board 6a. This compound foil 30 is produced by providing, on surfaces of a layer of a high-melting metal 14, layers of low-melting solder 21 made of Pb-free solder with a melting point of 260° C. or lower. If the high-melting metal 14 and the low-melting solder 21 as shown in FIG. 12 form no compound, a layer of a second high-melting metal for forming the low-melting solder 21 and a compound may be provided between the high-melting metal 14 and the low-melting solder 21 in some cases. These layers are formed through the plating, dipping, or the like.

Furthermore, after supplying the compound foil 30 onto the printed board 6a, the semiconductor element 3 and the passive element 4 are supplied on the compound foil 30 for connection. At this time, the high-melting metal 14 and the low-melting solder 21 are made to react with each other to transform a connection portion 15 into a compound with a high melting point. Next, the electrode formed on the surface of the semiconductor element 3 and the electrode formed on the printed board 6a are wire-bonded to each other by the wires 2. Then, they are sealed by using the mold resin 1 such as an epoxy-base resin. Through the above-mentioned process, the semiconductor module can be manufactured.

Next, regarding the semiconductor module according to the present embodiment, as shown in FIG. 10 described above, semiconductor modules manufactured under the conditions of Examples 4 to 6 (20 semiconductor modules for each condition) were examined as to whether the printed board (FR-4) 6a was damaged at the time of internal connection and whether the connection can be kept in the reflow tests at the maximum temperature of 260° C. The results are shown in FIG. 10.

The structures of the above-described connection portion 15 of FIG. 4 is set to "Sn—In (10 μm)+Ag/Al (10 μm)/Sn—In (10 μm)+Ag" in the Example 4, "Sn—In (10 μm)/(Cu/Invar alloy/Cu compound material) (100 μm)/Sn—In (10 μm)" in the Example 5, and "Sn—Zn (10 μm)+Ag/Al (100 μm)/Sn—Zn (10 μm)+Ag" in the Example 6, respectively, as an example among metallizations of Cu, Ag, Ni, and Au which react with Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders and form an intermetallic compound on metal surfaces of Al, Zn, Mg, Cu/an Invar alloy/a Cu composite material, a Cu/Cu$_2$O composite material, a Cu—Mo alloy, Ti, Mo, and W.

As a result, in all of the Examples 4 to 6, no abnormality was found in the printed board 6a under the connection condition of 240° C. for 10 minutes. Also, as a result of the reflow test on the manufactured semiconductor modules at the maximum temperature of 260° C., it has been confirmed in all of the semiconductor modules that the flash and peeling involved by remelting of the solder can be inhibited and the connection can be kept. In particular, since Al and CIC with stress absorbing effects are applied to the high-melting metals 14, the reliability to thermal shock is also higher than those of the above-described first to third examples.

From the above-described results, it has been found that the printed board 6a can be applied to the module board through the above-described connection scheme.

Therefore, the printed board 6a, which is capable of lowering in cost, lightening in weight, thinning, and decreasing in back height, can be applied to the module board. Furthermore, damage to this printed board 6a can be inhibited.

(Conventional form with respect to the Embodiments)

Regarding the conventional form (FIGS. 1 and 2) with respect to the above-described first and second embodiments of the present invention, as shown in FIG. 10, respective semiconductor modules produced by using Pb-5Sn solder (Comparison Example 1) and Au-20Sn solder (Comparison Example 2) to connect the semiconductor elements onto the printed boards (20 semiconductor modules for each condition) were examined as to whether the printed board 6 was damaged at the time of internal connection and whether the connection was kept in the reflow test at the maximum temperature of 260° C. The results are shown in FIG. 10.

The results has shown that, in the Comparison Examples 1 and 2, since the connection temperature was as high as 300° C. or higher, the printed boards 6 of all samples were burned and changed in color in spite of a short connection time of 1 minute in comparison with the above Examples 1 to 6. Moreover, a board deformation was found in some printed boards 6.

From the above-described results, they has proved clear that using the printed board 6 as the module board is difficult when the high-melting solder of Pb—5Sn or Au—20Sn is used.

As explained above, the invention made by the inventors has been specifically described based on the embodiments. Needless to say, however, the present invention is not limited to the above-described embodiments and may be variously modified within the scope of not departing from the gist thereof.

Figure 13:
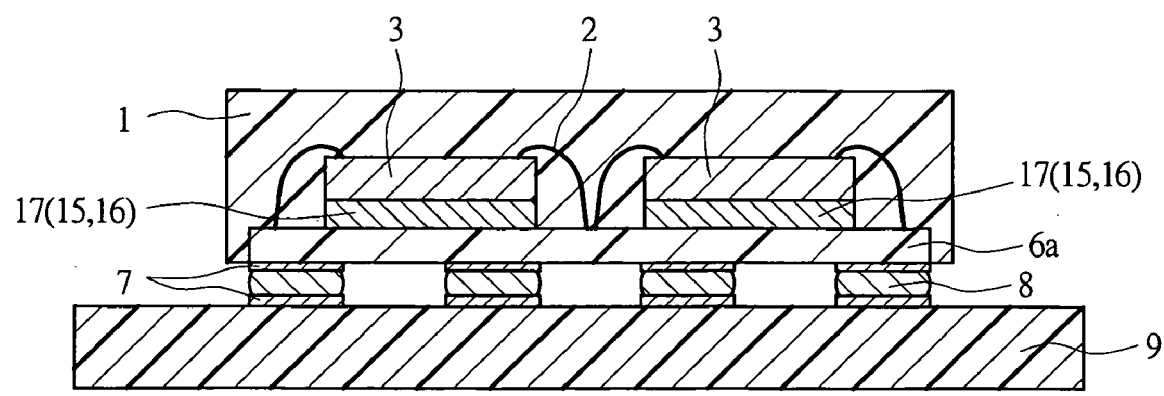
FIG. 13 is a sectional view showing a semiconductor module used as an application example in the embodiments of the present invention.

For example, as shown in FIG. 13, the connection schemes of the above-described Examples can be similarly applied also to a Multi Chip Module (MCM) in which the plurality of semiconductor elements 3 are connected inside the semiconductor module.

Figure 14:
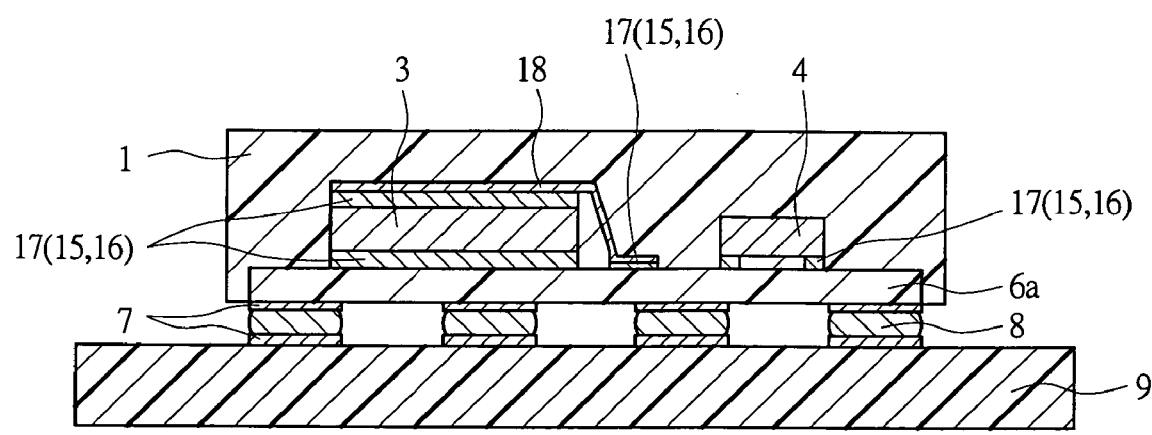
FIG. 14 is a sectional view showing a semiconductor module used as another application example in the embodiments of the present invention.

Furthermore, as shown in FIG. 14, the connection schemes of the above-described Examples can be similarly applied to the connection in which a strap 18 is used instead of the wire-bonding. At this time, by providing a connection portion of the strap 18 through plating or dipping to, for example, high-melting metal and a Pb-free solder layer with a melting point of 260° C. or lower or by connecting the strap by using the compound foil 30, it is possible to adopt the same connection scheme as that for connection between the semiconductor element 3a and the printed board 6a.

Figure 15:
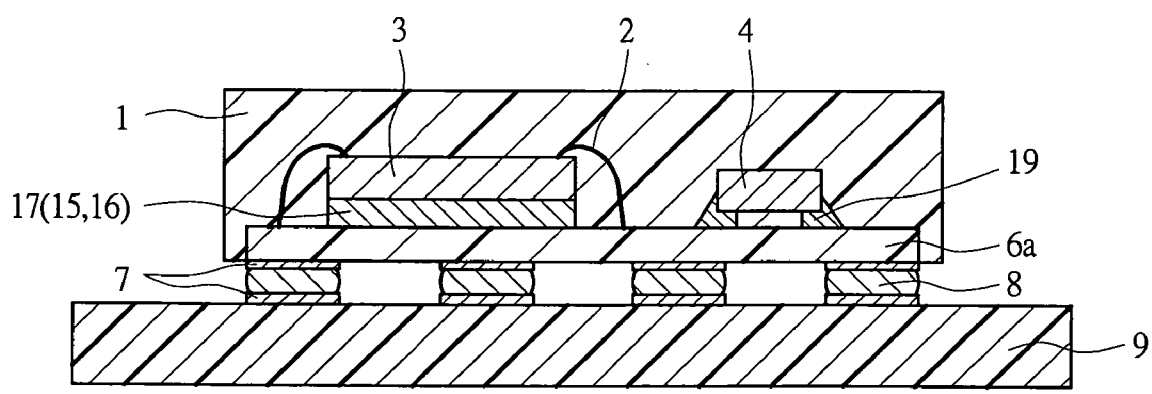
FIG. 15 is a section view showing a semiconductor module used as still another application example in the embodiments of the present invention.

Still further, as shown in FIG. 15, by mounting the semiconductor element 3 using the above-mentioned connecting technique and then mounting the passive element 4 using conductive adhesive 19, the connecting technique and the conductive adhesive can be used in common.

In addition to the above, the connecting methods of present invention can be applied to connection of sealing portions of a SAW filer, and an RF module, etc.

Effects obtained from representative ones of the inventions disclosed in the present application will be briefly described as follows.

The present invention relates to the semiconductor device connecting the semiconductor element (and the passive component) to the printed board, and can reduce the damages to the printed board by: specifying a material with a melting point of 260° C. or lower to be applied to the connection portion between the semiconductor element (and the passive component) and the printed board; providing the connection portion with the metal layer, which reacts with the Pb-free solder with a melting point of 260° C. or lower to form the compound with a melting point of 260° C. or higher; and increasing the reactive interface.

The present invention can be effectively used for the connections between the semiconductor element and the printed board and between the passive component and the printed board in the semiconductor device typified by the semiconductor module.

What is claimed is:

1. A semiconductor device comprising:
 a semiconductor element;
 a passive component;
 a printed board connecting said semiconductor element and said passive component; and
  a first connection portion between said semiconductor element and said printed board and a second connection portion between said passive component,
  wherein the first and second connection portions each include:
   a first layer of an intermetallic compound with a melting point of 260° C. or higher;
   a second layer of an intermetallic compound with a melting point of 260° C. or higher; and
   a third layer of a metal with a melting point of 260° C. or higher between said first layer and said second layer.

2. The semiconductor device according to claim 1,
 wherein said first and second layers of intermetallic compound with a melting point of 260° C. or higher is formed through a reaction caused at a time of connecting at least one of Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders each having a melting point of 260° C. or lower and at least one of Cu, Ag, Ni, and Au metals.

3. The semiconductor device according to claim 1,
 wherein said metal with a melting point of 260° C. or higher includes at least one of Cu, Ag, Ni, and Au that reacts with Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders each having a melting point of 260° C. or lower to form an intermetallic compound.

4. The semiconductor device according to claim 1,
 wherein said metal with a melting point of 260° C. or higher is such that Al, Zn, Mg, Cu/an Invar alloy/a Cu composite material, a Cu/Cu$_2$O composite material, a Cu—Mo alloy, Ti, Mo, and W is metallized with at least one of Cu, Ag, Ni, and Au, which reacts with Sn, In, Sn—Ag base, Sn—Cu base, Sn—Ag—Cu base, Sn—Zn base, Sn—Zn—Bi base, Sn—In base, In—Ag base, In—Cu base, Bi—Sn base, and Bi—In base Pb-free solders each having a melting point of 260° C. or lower to form an intermetallic compound.

5. A semiconductor device comprising:
 a semiconductor element;
 a printed board connecting said semiconductor element, and
  a connection portion between said semiconductor element and said printed board,
  wherein said connection portion includes,
   a first layer of an intermetallic compound with a melting point of 260° C. or higher;
   a second layer of an intermetallic compound with a melting point of 260° C. or higher;
   a third layer of a metal with a melting point of 260° C. or higher between said first layer and said second layer.

6. A semiconductor device according to claim 5,
 wherein said metal is at least one of Cu, Ag, Ni and Au.

7. A semiconductor device according to claim 5,
wherein said first and second layers of an intermetallic compound is formed through a reaction caused at a time of connecting at least one of Sn, In, Sn—Ag base, Sn—Cu base, Sn—Ag—Cu base; Sn—Zn—Bi base, Sn—In base, In—Ag base, In—Cu base, Bi—Sn base, and Bi—In base Pb-free solders each having a melting point of 260° C. or lower and at least one of Cu, Ag, Ni, and Au metal.

8. A semiconductor device according to claim 1,
wherein thicknesses of said first and second layers of an intermetallic compound are 1 μm to 20 μm.

9. A semiconductor device according to claim 1,
wherein both said intermetallic compound and said metal are Pb-free material.

10. A semiconductor device according to claim 5,
wherein thicknesses of said first and second layers of an intermetallic compound are 1 μm to 20 μm.

11. A semiconductor device according to claim 5,
wherein both said intermetallic compound and said metal are Pb-free material.

* * * * *